United States Patent
Sun et al.

(10) Patent No.: US 7,549,138 B2
(45) Date of Patent: *Jun. 16, 2009

(54) PARALLEL PROGRAMMABLE ANTIFUSE FIELD PROGRAMMABLE GATE ARRAY DEVICE (FPGA) AND A METHOD FOR PROGRAMMING AND TESTING AN ANTIFUSE FPGA

(75) Inventors: Shin-Nan Sun, Fremont, CA (US); Wayne W. Wong, Sunnyvale, CA (US)

(73) Assignee: Actel Corporation, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/837,700

(22) Filed: Aug. 13, 2007

(65) Prior Publication Data

US 2008/0028354 A1 Jan. 31, 2008

Related U.S. Application Data

(60) Continuation of application No. 11/532,757, filed on Sep. 18, 2006, now Pat. No. 7,269,814, which is a continuation of application No. 10/833,608, filed on Apr. 27, 2004, now Pat. No. 7,111,272, which is a division of application No. 10/267,917, filed on Oct. 8, 2002, now Pat. No. 6,885,218.

(51) Int. Cl.
G06F 17/50 (2006.01)
G06F 7/38 (2006.01)
H03K 19/173 (2006.01)

(52) U.S. Cl. .......................................... 716/16; 326/37

(58) Field of Classification Search .................. 326/37, 326/47, 38, 41; 716/16–17
See application file for complete search history.

(56) References Cited

U.S. PATENT DOCUMENTS

| | | | |
|---|---|---|---|
| 4,255,748 A | 3/1981 | Bartlett |
| 4,625,313 A | 11/1986 | Springer |
| 4,638,187 A | 1/1987 | Boler et al. |
| 4,638,243 A | 1/1987 | Chan |
| 4,684,830 A | 8/1987 | Tsui et al. |
| 4,700,130 A | 10/1987 | Bloemen |
| 4,706,216 A | 11/1987 | Carter |
| 4,713,557 A | 12/1987 | Carter |
| 4,717,912 A | 1/1988 | Harvey et al. |

(Continued)

OTHER PUBLICATIONS

Copending U.S. Appl. No. 11/425,541, filed Jun. 26, 2006 entitled Repeatable Block Producing a Non-Uniform Routing Architecture in a Field Programmable Gate Array Having Segmented Tracks.
Copending U.S. Appl. No. 11/677,432, filed Feb. 21, 2007 entitled Dedicated Input/Output First In/First Out Module for a Field Programmanle Gate Array.
Copending U.S. Appl. No. 11/548,199, filed Oct. 10, 2006 entitled Filed-Programmable Gate Array Low Voltage Differential Signaling Driver Utilizing Two Complimentary Output Buffers.
US 6,564,273, 05/2003, Plants (withdrawn)

Primary Examiner—Stacy A Whitmore
(74) Attorney, Agent, or Firm—Lewis and Roca LLP

(57) ABSTRACT

The present invention comprises apparatus and a method for simultaneously programming multiple antifuses in a multiple tile field programmable gate array (FPGA). The invention comprises an FPGA having a plurality of logic modules with programmable elements. The logic modules are partitioned into a plurality of individually programmable groups and an isolation device may be coupled between the individually programmable groups of logic modules such that each of the programmable elements in each of the plurality of individually programmable logic modules may be programmed concurrently.

9 Claims, 13 Drawing Sheets

U.S. PATENT DOCUMENTS

| | | |
|---|---|---|
| 4,718,042 A | 1/1988 | Moll et al. |
| 4,742,252 A | 5/1988 | Agrawal |
| 4,758,745 A | 7/1988 | Elgamal et al. |
| 4,772,812 A | 9/1988 | Desmarais |
| 4,800,176 A | 1/1989 | Kakumu et al. |
| 4,857,774 A | 8/1989 | El-Ayat et al. |
| 4,870,300 A | 9/1989 | Nakaya et al. |
| 4,870,302 A | 9/1989 | Freeman |
| 4,873,459 A | 10/1989 | El Gamal et al. |
| 4,928,026 A | 5/1990 | Ebesyu |
| 4,930,097 A | 5/1990 | Ledenbach et al. |
| 4,935,645 A | 6/1990 | Lee |
| 4,959,561 A | 9/1990 | McDermott et al. |
| 4,978,905 A | 12/1990 | Hoff et al. |
| 5,008,855 A | 4/1991 | Eltoukhy et al. |
| 5,046,035 A | 9/1991 | Jigour et al. |
| 5,083,083 A | 1/1992 | El Ayat et al. |
| 5,121,394 A | 6/1992 | Russell |
| 5,122,685 A | 6/1992 | Chan et al. |
| 5,126,282 A | 6/1992 | Chiang et al. |
| 5,132,571 A | 7/1992 | McCollum et al. |
| 5,144,166 A | 9/1992 | Camarota et al. |
| 5,187,392 A | 2/1993 | Allen |
| 5,191,241 A | 3/1993 | McCollum et al. |
| 5,198,705 A | 3/1993 | Galbraith et al. |
| 5,208,491 A | 5/1993 | Ebeling et al. |
| 5,208,530 A | 5/1993 | El Ayat et al. |
| 5,220,213 A | 6/1993 | Chan et al. |
| 5,220,215 A | 6/1993 | Douglas et al. |
| 5,221,865 A | 6/1993 | Phillips et al. |
| 5,222,066 A | 6/1993 | Grula et al. |
| 5,223,792 A | 6/1993 | El Ayat et al. |
| 5,258,319 A | 11/1993 | Inuishi et al. |
| 5,272,388 A | 12/1993 | Bakker |
| 5,286,922 A | 2/1994 | Curtiss |
| 5,293,133 A | 3/1994 | Birkner et al. |
| 5,294,846 A | 3/1994 | Paivinen |
| 5,300,830 A | 4/1994 | Hawes |
| 5,300,832 A | 4/1994 | Rogers |
| 5,304,871 A | 4/1994 | Dharmarajan et al. |
| 5,309,091 A | 5/1994 | El Ayat et al. |
| 5,317,698 A | 5/1994 | Chan |
| 5,341,092 A | 8/1994 | El Ayat et al. |
| 5,365,165 A | 11/1994 | El Ayat et al. |
| 5,365,485 A | 11/1994 | Ward et al. |
| 5,367,207 A | 11/1994 | Goetting et al. |
| 5,375,089 A | 12/1994 | Lo |
| 5,394,033 A | 2/1995 | Tsui et al. |
| 5,394,034 A | 2/1995 | Becker et al. |
| 5,396,128 A | 3/1995 | Dunning et al. |
| 5,397,939 A | 3/1995 | Gordon et al. |
| 5,399,920 A | 3/1995 | Van Tran |
| 5,400,262 A | 3/1995 | Mohsen |
| 5,430,335 A | 7/1995 | Tanoi |
| 5,430,687 A | 7/1995 | Hung et al. |
| 5,432,441 A | 7/1995 | El Ayat et al. |
| 5,451,887 A | 9/1995 | El Ayat et al. |
| 5,455,525 A | 10/1995 | Ho et al. |
| 5,469,003 A | 11/1995 | Kean |
| 5,469,396 A | 11/1995 | Eltoukhy |
| 5,473,268 A | 12/1995 | Declercq et al. |
| 5,485,103 A | 1/1996 | Pedersen et al. |
| 5,486,775 A | 1/1996 | Veenstra |
| 5,495,181 A | 2/1996 | Kolze |
| 5,526,312 A | 6/1996 | Eltoukhy |
| 5,537,057 A | 7/1996 | Leong et al. |
| 5,546,019 A | 8/1996 | Liao |
| 5,559,464 A | 9/1996 | Orii et al. |
| 5,572,476 A | 11/1996 | Eltoukhy |
| 5,594,363 A | 1/1997 | Freeman et al. |
| 5,600,262 A | 2/1997 | Kolze |
| 5,600,264 A | 2/1997 | Duong et al. |
| 5,666,322 A | 9/1997 | Conkle |
| 5,670,905 A | 9/1997 | Keeth et al. |
| 5,742,181 A | 4/1998 | Rush |
| 5,744,979 A | 4/1998 | Goetting |
| 5,744,980 A | 4/1998 | McGowan et al. |
| 5,777,887 A | 7/1998 | Marple et al. |
| 5,801,547 A | 9/1998 | Kean |
| 5,809,281 A | 9/1998 | Steele et al. |
| 5,815,003 A | 9/1998 | Pedersen |
| 5,815,004 A | 9/1998 | Trimberger et al. |
| 5,821,776 A | 10/1998 | McGowan |
| 5,825,200 A | 10/1998 | Kolze |
| 5,825,201 A | 10/1998 | Kolze |
| 5,825,202 A | 10/1998 | Tavana et al. |
| 5,825,662 A | 10/1998 | Trimberger |
| 5,828,230 A | 10/1998 | Young |
| 5,828,538 A | 10/1998 | Apland et al. |
| 5,831,448 A | 11/1998 | Kean |
| 5,832,892 A | 11/1998 | Yaoita |
| 5,835,165 A | 11/1998 | Keate et al. |
| 5,835,998 A | 11/1998 | Pedersen |
| 5,838,167 A | 11/1998 | Erickson et al. |
| 5,838,584 A | 11/1998 | Kazarian |
| 5,838,954 A | 11/1998 | Trimberger |
| 5,847,441 A | 12/1998 | Cutter et al. |
| 5,847,577 A | 12/1998 | Trimberger |
| 5,848,005 A | 12/1998 | Cliff et al. |
| 5,848,006 A | 12/1998 | Nagata |
| 5,850,151 A | 12/1998 | Cliff et al. |
| 5,850,152 A | 12/1998 | Cliff et al. |
| 5,850,564 A | 12/1998 | Ting et al. |
| 5,852,608 A | 12/1998 | Csoppenszky et al. |
| 5,854,763 A | 12/1998 | Gillingham et al. |
| 5,859,542 A | 1/1999 | Pedersen |
| 5,859,543 A | 1/1999 | Kolze |
| 5,859,544 A | 1/1999 | Norman |
| 5,861,761 A | 1/1999 | Kean |
| 5,869,981 A | 2/1999 | Agrawal et al. |
| 5,870,327 A | 2/1999 | Gitlin et al. |
| 5,870,586 A | 2/1999 | Baxter |
| 5,880,492 A | 3/1999 | Duong et al. |
| 5,880,512 A | 3/1999 | Gordon et al. |
| 5,880,597 A | 3/1999 | Lee |
| 5,880,598 A | 3/1999 | Duong |
| 5,883,526 A | 3/1999 | Reddy et al. |
| 5,883,850 A | 3/1999 | Lee et al. |
| 5,892,684 A | 4/1999 | Chua |
| 5,949,719 A | 9/1999 | Clinton et al. |
| 5,952,847 A | 9/1999 | Plants et al. |
| 5,991,908 A | 11/1999 | Baxter et al. |
| 5,994,934 A | 11/1999 | Yoshimura et al. |
| 6,011,744 A | 1/2000 | Sample et al. |
| 6,034,677 A | 3/2000 | Noguchi et al. |
| 6,038,627 A | 3/2000 | Plants |
| 6,049,487 A | 4/2000 | Plants et al. |
| 6,100,715 A | 8/2000 | Agrawal et al. |
| 6,111,448 A | 8/2000 | Shibayama |
| 6,157,213 A | 12/2000 | Voogel |
| 6,169,416 B1 | 1/2001 | Eaton et al. |
| 6,181,174 B1 | 1/2001 | Fujieda et al. |
| 6,216,258 B1 | 4/2001 | Mohan et al. |
| 6,242,943 B1 | 6/2001 | El Ayat |
| 6,260,182 B1 | 7/2001 | Mohan et al. |
| 6,289,068 B1 | 9/2001 | Hassoun et al. |
| 6,292,016 B1 | 9/2001 | Jefferson et al. |
| 6,292,925 B1 | 9/2001 | Dellinger et al. |
| 6,329,839 B1 | 12/2001 | Pani et al. |
| 6,353,334 B1 | 3/2002 | Schultz et al. |
| 6,418,059 B1 | 7/2002 | Kreifels et al. |
| 6,430,088 B1 | 8/2002 | Plants et al. |
| 6,437,650 B1 | 8/2002 | Sung et al. |
| 6,480,026 B2 | 11/2002 | Andrews et al. |

| Patent No. | Date | Inventor |
|---|---|---|
| 6,496,887 B1 | 12/2002 | Plants |
| 6,501,295 B1 | 12/2002 | Burr |
| 6,519,753 B1 | 2/2003 | Ang et al. |
| 6,570,805 B2 | 5/2003 | McCollum |
| 6,727,726 B1 | 4/2004 | Plants |
| 6,734,702 B1 | 5/2004 | Ikeoku et al. |
| 6,750,674 B1 | 6/2004 | Kundu et al. |
| 6,751,723 B1 | 6/2004 | Kundu et al. |
| 6,867,615 B1 | 3/2005 | Plants et al. |
| 6,885,218 B1 | 4/2005 | Sun et al. |
| 6,891,394 B1 | 5/2005 | Yu et al. |
| 6,891,396 B1 | 5/2005 | Kundu et al. |
| 6,946,871 B1 | 9/2005 | Kundu et al. |
| 6,980,028 B1 | 12/2005 | Plants et al. |
| 7,075,328 B2 | 7/2006 | Plants |
| 7,075,334 B1 | 7/2006 | Kundu et al. |
| 7,102,385 B2 | 9/2006 | Plants et al. |
| 7,111,272 B1 | 9/2006 | Sun et al. |
| 7,119,573 B2 | 10/2006 | Yu et al. |
| 7,126,842 B2 | 10/2006 | Plants |
| 7,199,609 B1 | 4/2007 | Plants et al. |
| 7,269,814 B1 | 9/2007 | Sun et al. |

PARALLEL PROGRAMMABLE ANTIFUSE FIELD PROGRAMMABLE GATE ARRAY DEVICE (FPGA) AND A METHOD FOR PROGRAMMING AND TESTING AN ANTIFUSE FPGA

CROSS-REFERENCE TO RELATED APPLICATIONS

This application claims priority to co-pending U.S. patent application Ser. No. 11/532,757, filed Sep. 18, 2006, which is a continuation of U.S. patent application Ser. No. 10/833,608, filed Apr. 27, 2004, now issued as U.S. Pat. No. 7,111,272, which is a divisional of U.S. patent application Ser. No. 10/267,917, filed Oct. 8, 2002, now issued as U.S. Pat. No. 6,885,218, which are hereby incorporated by reference as if set forth herein.

BACKGROUND OF THE SYSTEM

1. Field of the System

The present system relates to field programmable gate array (FPGA) devices. More specifically, the system relates to a parallel-programmable antifuse FPGA and a method for programming a parallel-programmable antifuse FPGA.

2. Background

FPGAs are known in the art. An FPGA comprises any number of logic modules, an interconnect routing architecture and programmable elements that may be programmed to selectively interconnect the logic modules to one another and to define the functions of the logic modules. To implement a particular circuit function, the circuit is mapped into an array and the wiring channels appropriate connections are programmed to implement the necessary wiring connections that form the user circuit.

A field programmable gate array circuit can be programmed to implement virtually any set of functions. Input signals are processed by the programmed circuit to produce the desired set of outputs. Such inputs flow from a user's system, through input buffers and through the circuit, and finally back out the user's system via output buffers. Such buffers may provide any or all of the following input/output (I/O) functions: voltage gain, current gain, level translation, delay, signal isolation or hysteresis.

An FPGA core tile may be employed as a stand-alone FPGA, repeated in a rectangular array of core tiles, or included with other devices in a system-on-a-chip (SOC). The core FPGA tile may include an array of logic modules, and input/output modules. Horizontal and vertical routing channels provide interconnections between the logic modules and the I/O modules. Programmable connections are provided by programmable elements between the routing resources.

The programmable elements in an FPGA can be either one-time programmable or re-programmable. Re-programmable elements used in FPGA technologies may comprise transistors or other re-programmable elements as is well known to those of ordinary skill in the art. One-time programmable elements used in FPGA technologies may comprise antifuse devices.

Antifuse devices are well known in the integrated circuit art. Antifuse devices comprise a pair of conductive electrodes separated by at least one layer of antifuse material and may include one or more diffusion barrier layers. Prior to programming, antifuses exhibit very high resistance between the two electrodes and may be considered to be open circuits. A programming process disrupts the antifuse material and creates a low-impedance connection between the two conductive electrodes.

The antifuses in an antifuse FPGA are programmed one antifuse at a time. There are two components considered when computing total programming time in an antifuse FPGA—overhead time ($T_{oh}$) and fuse time ($T_{fuse}$). Overhead time is the time required for a computer system to set a programming environment that includes reading data from a computer disk, compiling the data, translating the data to a bit stream readable by the computer and loading the bit stream into a long shift register (LSR). The LSR is the main mechanism to setup a program/test environment in an antifuse FPGA.

Fuse time is the time it takes to program an individual antifuse. Fuse time is usually an average based on the total number of antifuses being programmed since each antifuse may have a slightly different programming time. The total time entailed in programming an antifuse FPGA is the overhead time plus the sum of the fuse times as set forth in the equation below.

$$T_{total} = T_{oh} + \Sigma T_{fuse}$$

FIG. 1 is a schematic diagram illustrating an antifuse prior to programming in a prior-art antifuse FPGA. Antifuse 12 to be programmed is coupled between horizontal routing track 18 and vertical routing track 24. Horizontal routing track 18 and vertical routing track 24 are used to route signals in the FPGA after programming. Each routing track has a direct-address transistor associated with it having its source/drain coupled to the routing track. For example, in circuit 10, direct address transistor 14 has its source/drain coupled to horizontal track 18 and its other source/drain coupled to programming voltage line 20 which generally runs perpendicular to horizontal routing track 18. Direct-address transistor 14 has its gate coupled to horizontal direct-address line 28 which runs perpendicular to programming voltage line 20. Direct-address transistor 16 has its source/drain coupled to vertical routing track 24 and its other source drain coupled to programming voltage line 22 which generally runs perpendicular to vertical routing track 24. Direct-address transistor 16 has its gate coupled to vertical direct-address line 26 which runs perpendicular to programming voltage line 22.

FIG. 2 is a schematic diagram of the programming path of antifuse 12 immediately prior to programming. Circuit 10 comprises antifuse 12 coupled between horizontal routing track 18 and vertical routing track 24, direct-address transistor 14 and direct-address transistor 16. To program antifuse 12, Vpp is applied to the source/drain of direct-address transistor 14 and ground is applied to the source/drain of direct-address transistor 16 and a super voltage ($V_{sv}$) is applied to the gates of transistors 14 and 16. Antifuse 12 is shown programmed in the schematic drawing illustrated in FIG. 3. As also shown in FIG. 3, as current flows through the ruptured dielectric of antifuse 12, the resistance level drops. This is referred to by those skilled in the art as soaking.

FIG. 4 is a schematic diagram illustrating the problems inherent in concurrent programming of antifuses in the prior art. Antifuses 52 and 54 are the fuses to be programmed. Antifuses 56 and 58 are not to be programmed. Based on the programming algorithm set forth above, vertical routing tracks 60 and 62 are charged to Vpp and horizontal routing tracks 64 and 66 are pulled down to ground. Antifuses 52 and 54 will see full Vpp across the dielectric and rupture. However, while antifuses 56 and 58 are not to be programmed, they will also have full Vpp stress across the dielectric and may be programmed despite the intention that they not be programmed.

In an antifuse FPGA, the antifuses in the FPGA are programmed one at time. As the size of the FPGA increases, the number of antifuses becomes much greater and the programming time increases. Hence, there is a need for an antifuse FPGA with a shorter programming time. Thus, there is also a need for an antifuse FPGA in which the antifuses to be programmed can be concurrently programmed.

SUMMARY OF THE SYSTEM

The present invention comprises an FPGA having a plurality of logic modules with programmable elements. The logic modules are partitioned into a plurality of individually programmable groups and an isolation device may be coupled between the individually programmable groups of logic modules such that each of the programmable elements in each of the plurality of individually programmable logic modules may be programmed simultaneously.

The present invention also comprises a method of programming a plurality of tiles in an FPGA comprising loading the address data identifying which antifuses in tiles 1 through N are to be programmed. Next, from the loaded address data, one antifuse is selected in each of tiles 1 through N that need to be programmed. Then, the selected antifuses in each of the tiles 1 through N are programmed. Next, it is determined whether all the antifuses in tiles 1 through N are programmed. If all the antifuses in tiles 1 through N are not programmed, the software module selects from the loaded addresses the next one antifuse in each tile 1 through N that needs to be programmed. Finally, if all the antifuses are programmed in tiles 1 through N, the program ends.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE SYSTEM

Those of ordinary skill in the art will realize that the following description of the present system is illustrative only and not in any way limiting. Other embodiments will readily suggest themselves to such skilled persons having the benefit of this disclosure.

Similar designations used herein are intended to designate substantially similar matter.

Figure 1:
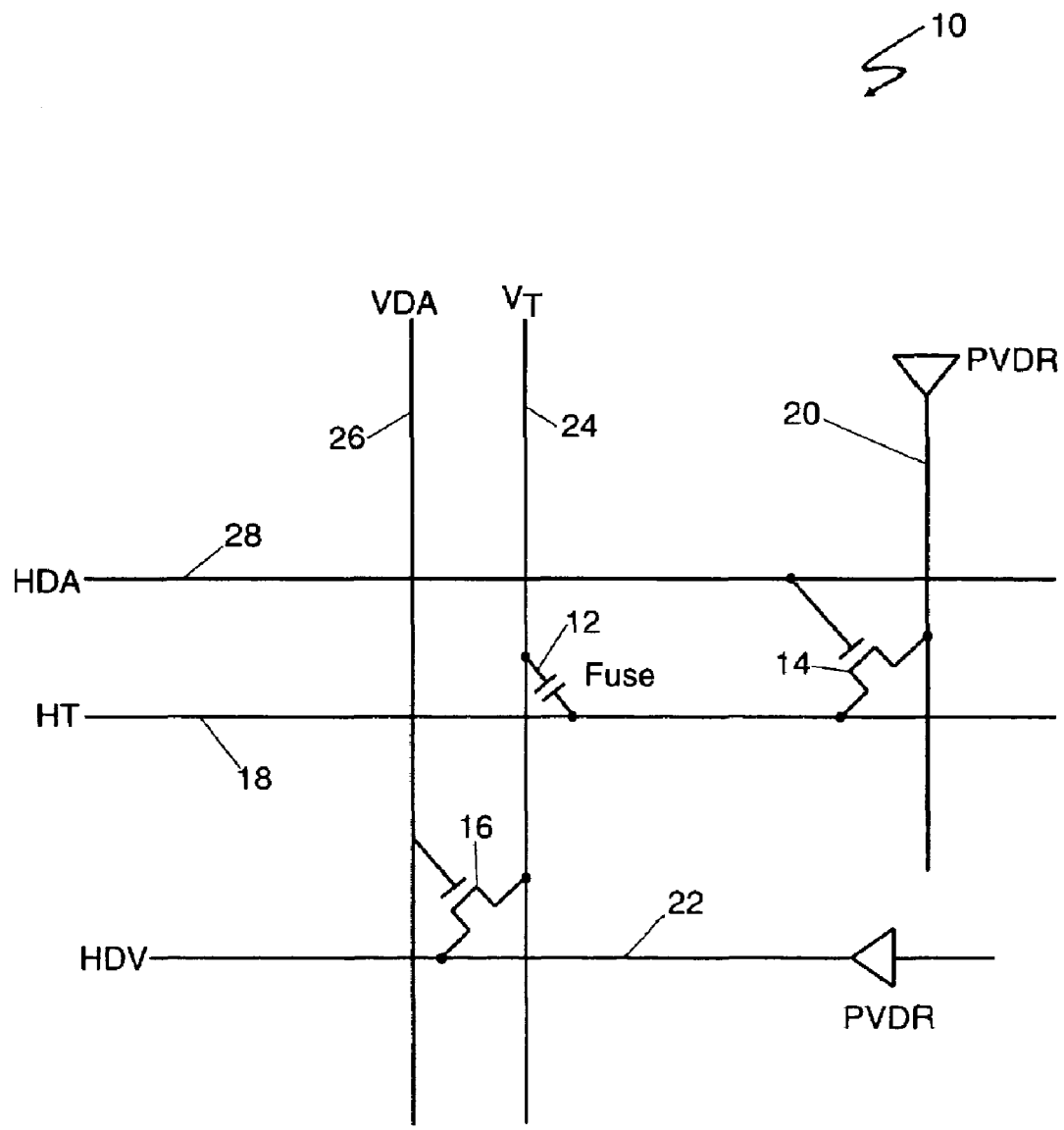
FIG. 1 is a schematic diagram of an antifuse programming circuit before programming.
Figure 2:
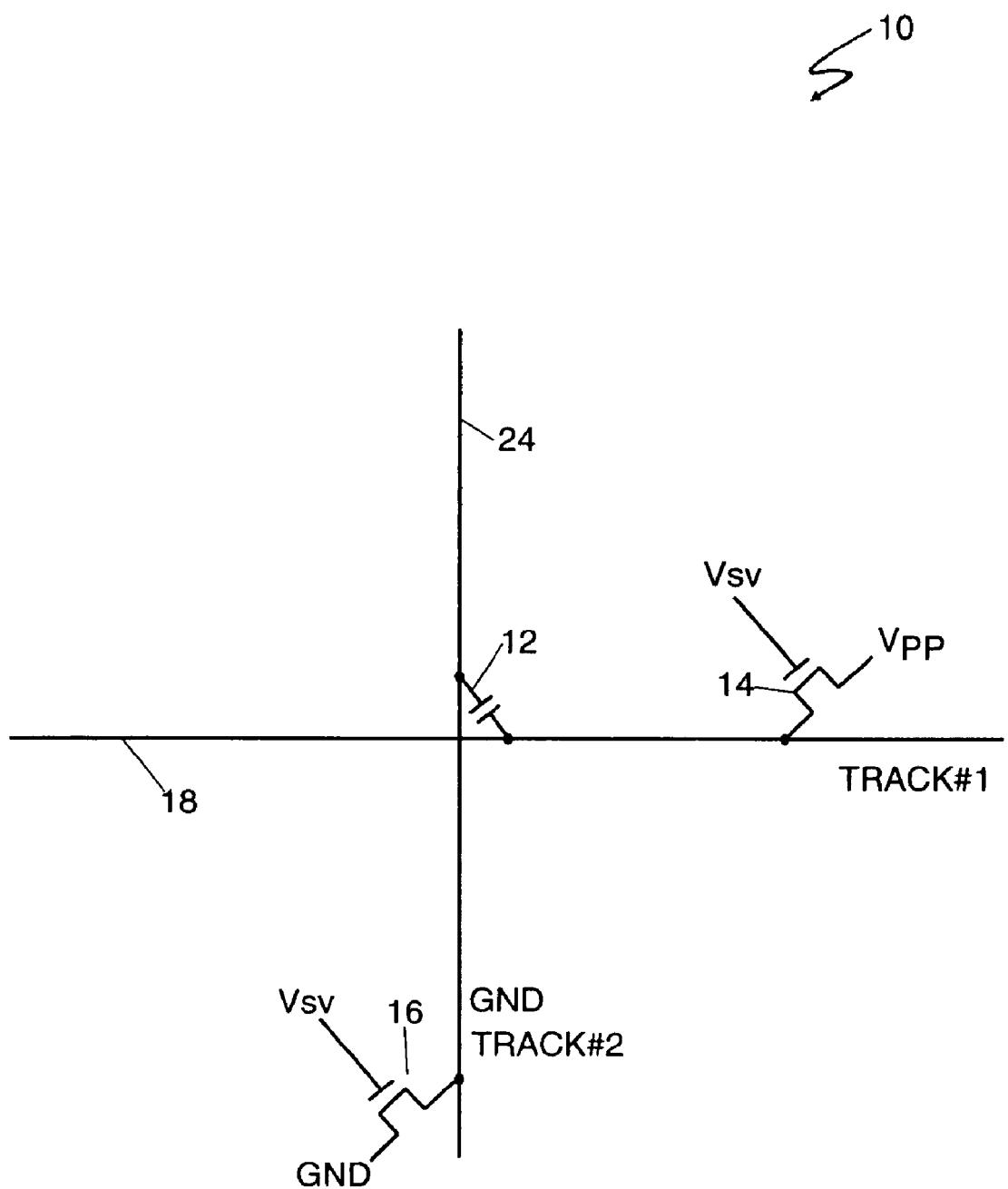
FIG. 2 is a schematic diagram of an antifuse circuit programming path prior to programming.
Figure 3:
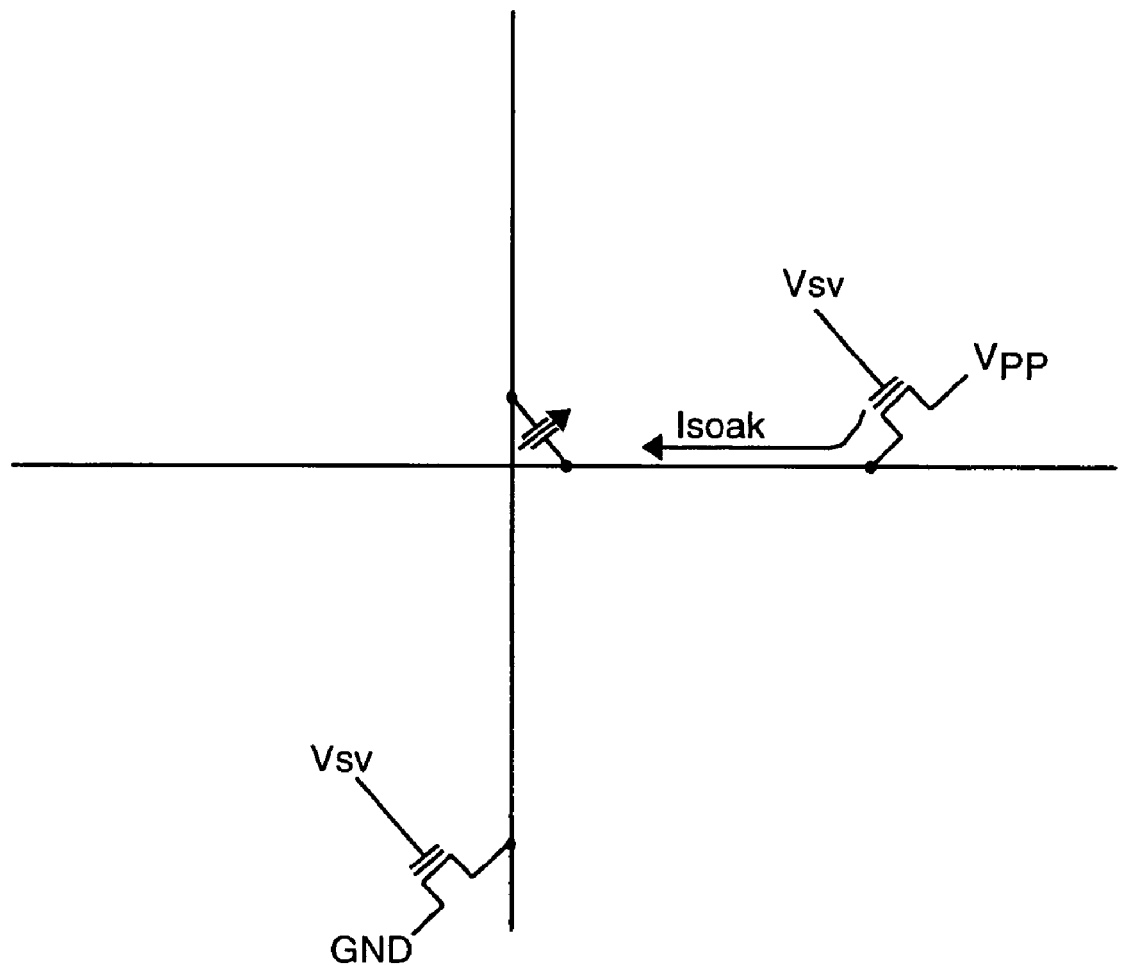
FIG. 3 is a schematic diagram of an antifuse circuit programming path after programming.
Figure 4:
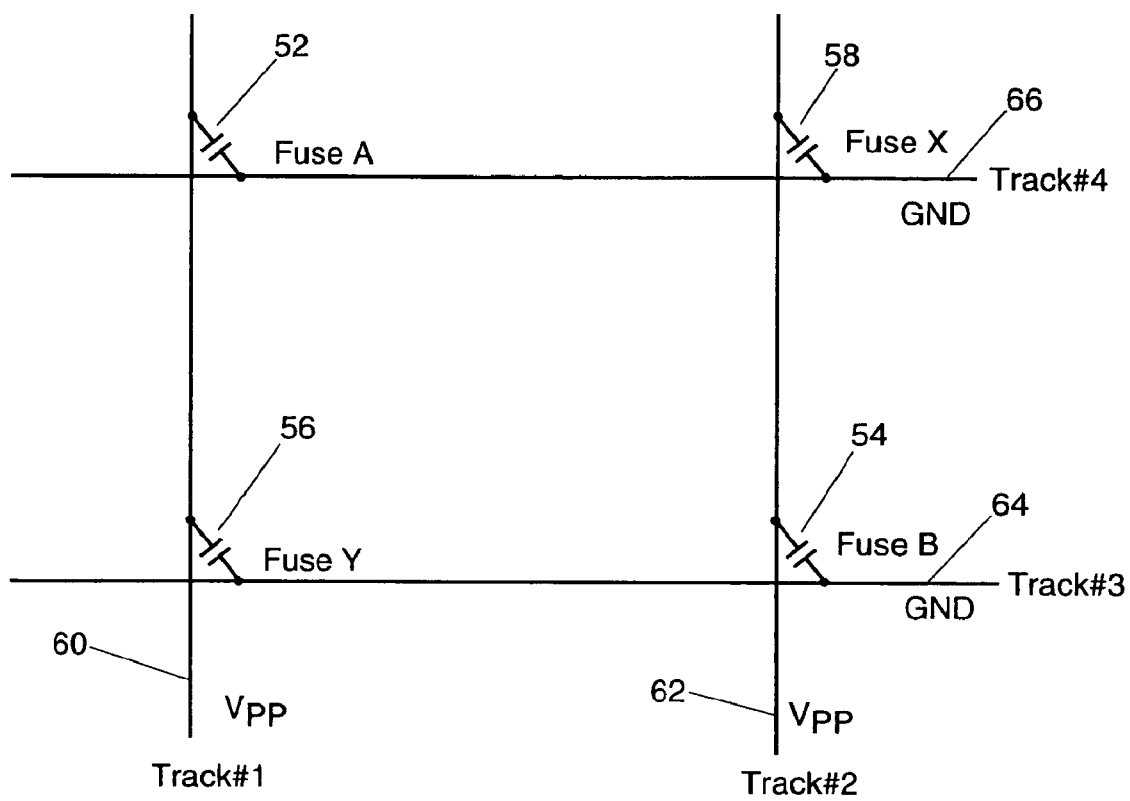
FIG. 4 is a schematic diagram of a prior art antifuse FPGA circuit illustrating problems with attempted concurrent programming.
Figure 5:
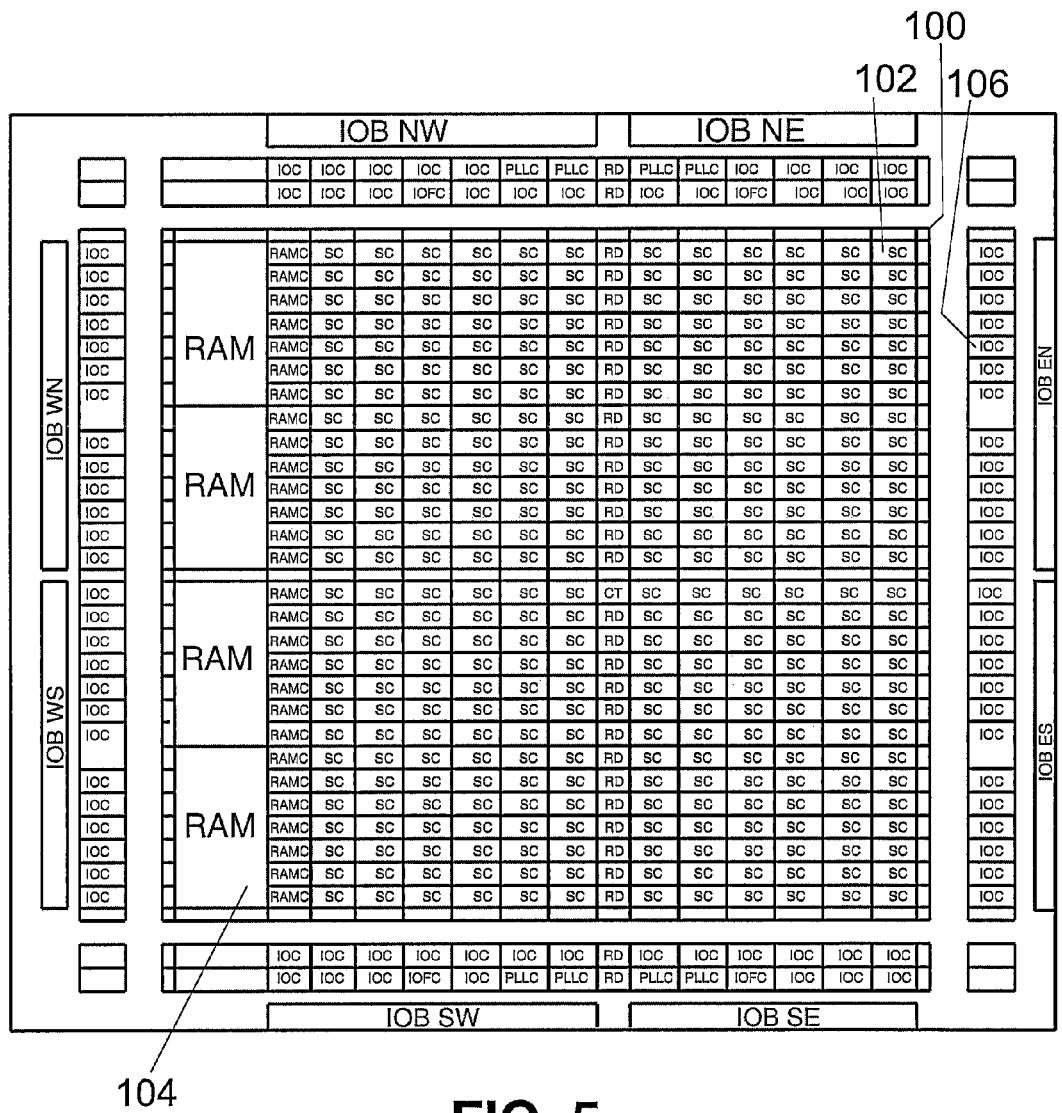
FIG. 5 is a simplified block diagram of a tile of an antifuse FPGA of the present system.
Figure 6:
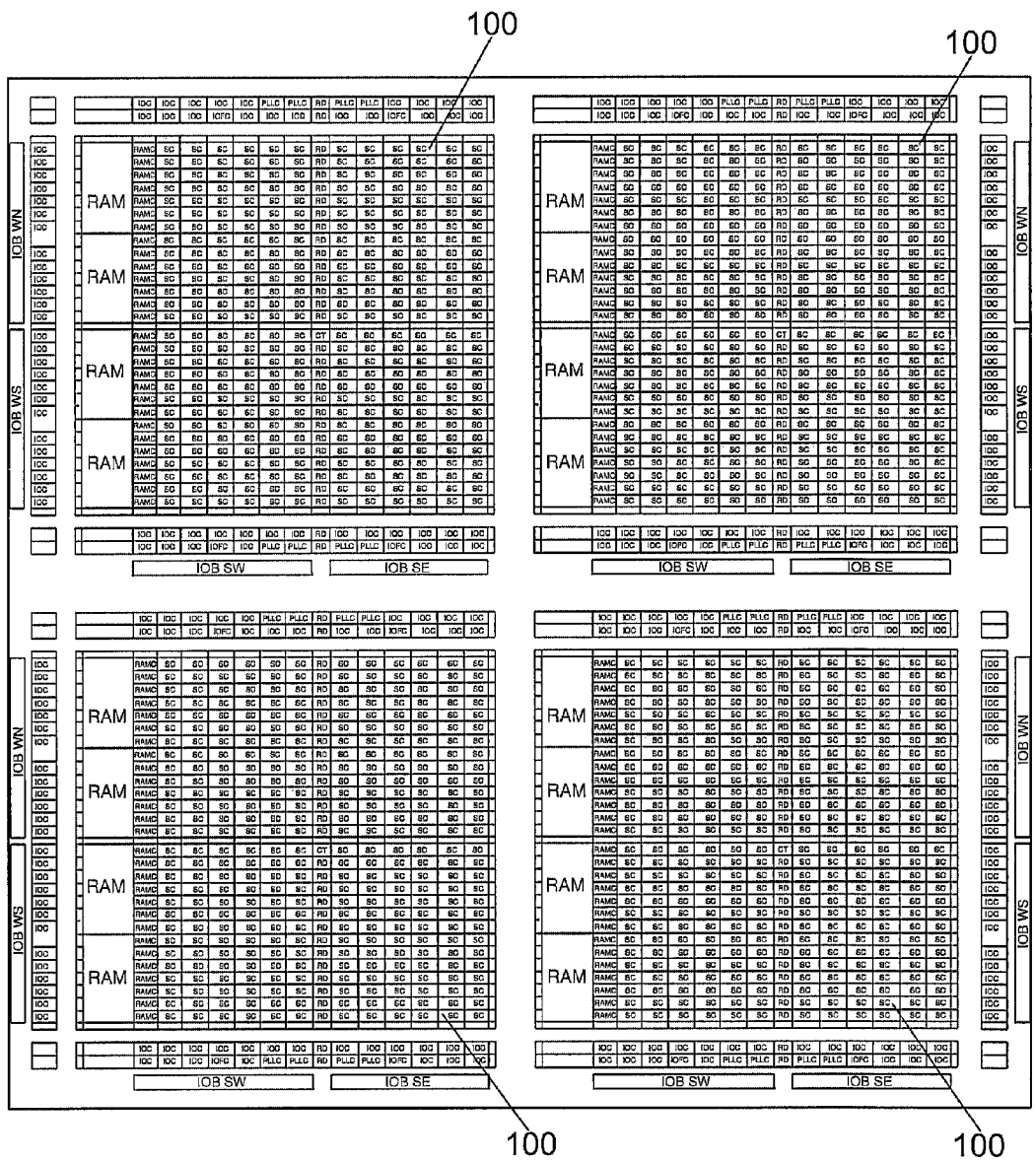
FIG. 6 is a simplified block diagram an antifuse FPGA comprising four tiles of the present system.

FIG. 5 is a simplified block diagram of an example of a core tile 100 of an antifuse FPGA of the present invention. Core tile 100 comprises an array of logic modules 102 and a column of RAM modules 104. An FPGA can be built from a single core tile 100, surrounded by columns and rows of I/O modules as illustrated in FIG. 5 or as illustrated in FIG. 6 as an antifuse FPGA of the having four or more core tiles 100.

Figure 7:
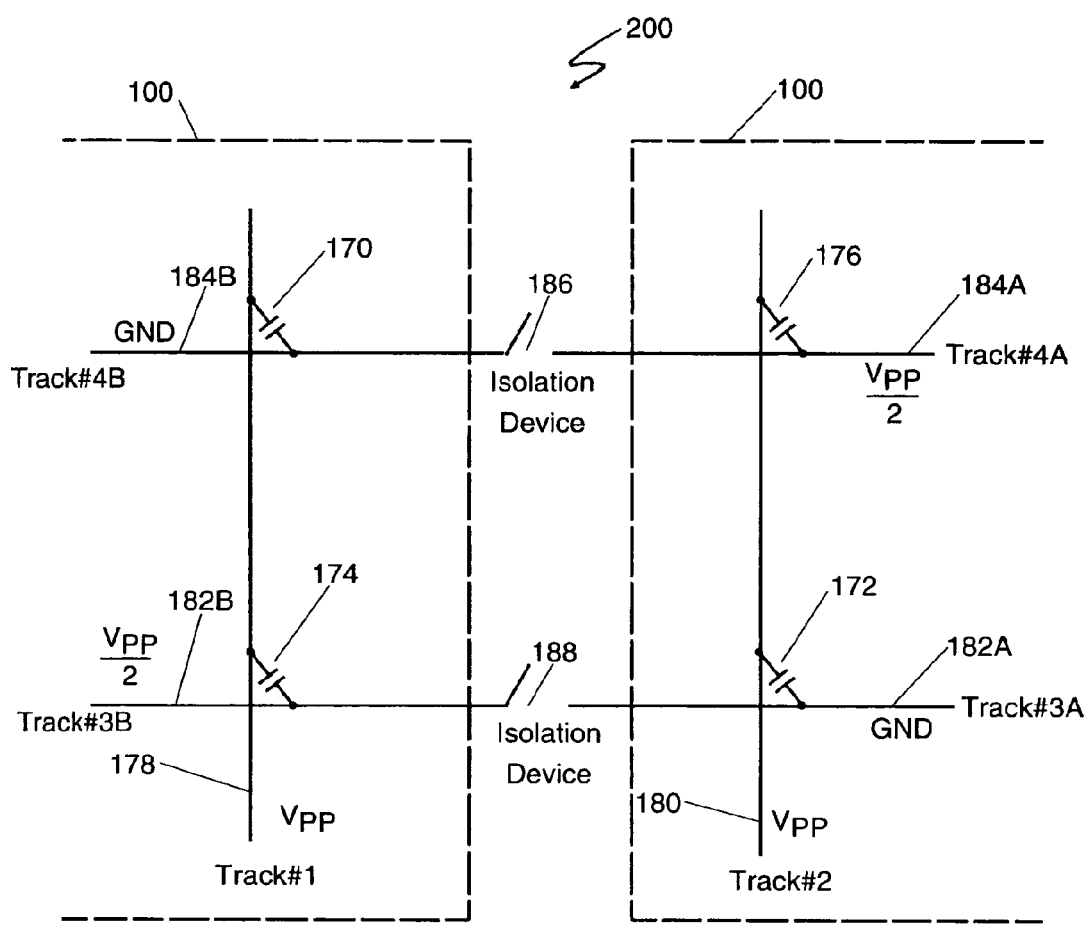
FIG. 7 is a schematic diagram of the programming circuit of the current system.

FIG. 7 is a schematic diagram illustrating the concurrently programmable antifuse FPGA 200 of the current system. Antifuse FPGA 200 of the current system is partitioned into several programming independent tiles illustrated in FIGS. 5, and 7 by reference numeral 100.

Referring to FIG. 7, antifuses 170 and 174 are located in a first core tile 100. Antifuses 172 and 176 are located in a second core tile 100. In the present system, during programming core tiles 100 are treated as isolated tiles. Core tiles are isolated during the programming of the antifuse FPGA by isolation devices 186 and 188.

Referring still to FIG. 7, in this example antifuses 170 and 172 are the fuses to be programmed. Antifuses 174 and 176 are the fuses not to be programmed. During programming, isolation devices, illustrated by reference numerals 186 and 188, are shown as open switches. During programming, isolation device 188 divides horizontal track 182 into isolated portions 182a and 182b while isolation device 186 divides horizontal track 184 into isolated portions 184a and 184b. Antifuse 170 is programmed by applying Vpp to vertical routing track 178 and pulling horizontal routing track 184b to ground. Antifuse 174 will remain unprogrammed because Vpp/2 is applied to horizontal routing track 182b. Antifuse 172 is programmed by applying Vpp to vertical routing track 180 and pulling horizontal routing track 182a to ground. Antifuse 176 will remain unprogrammed because Vpp/2 is applied to horizontal routing track 184a. Thus, during programming, each tile can be treated as a separate device, allowing the programming of one antifuse in each tile concurrently, instead of consecutively, and providing a much faster programming environment.

Figure 8:
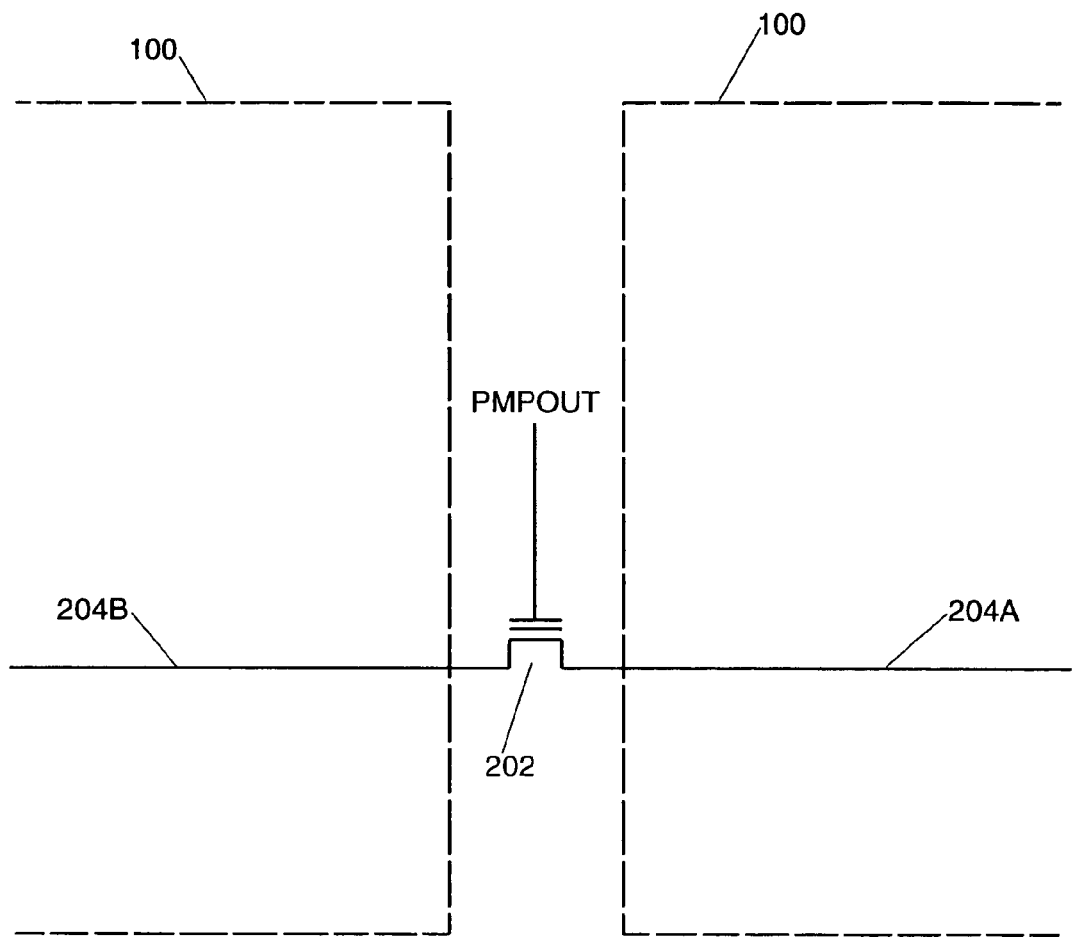
FIG. 8 is a schematic diagram illustrating an embodiment of an isolation device of the present system.

Isolation devices 186 and 188 can be implemented in several different ways. FIG. 8 illustrates a schematic of one embodiment of an isolation device 202 between tiles 100. Isolation device 202 partitions horizontal routing track 204 into isolated horizontal routing tracks 204a and 204b. Isolation device 202 is a transistor (referred to hereinafter as isolation transistor 202) with its source/drain bridging horizontal routing tracks 204a and 204b. Isolation transistor 202 has a gate that is driven by a voltage that is approximately two volts higher than the core operating voltage by an external source or the voltage can be generated by a built-in pump circuit, well known to those of ordinary skill in the art, which generates a PMPOUT signal to control the gate of isolation transistor 202. PMPOUT signal can be set as a logical high or low during programming/testing. Isolation device 202 separates signals on horizontal routing tracks 204a and 204b when the PMPOUT signal is set at logical low. For normal operation, PMPOUT is always set at logical high such that isolation transistor becomes conductive and joins horizontal routing tracks 204a and 204b together.

Figure 9:
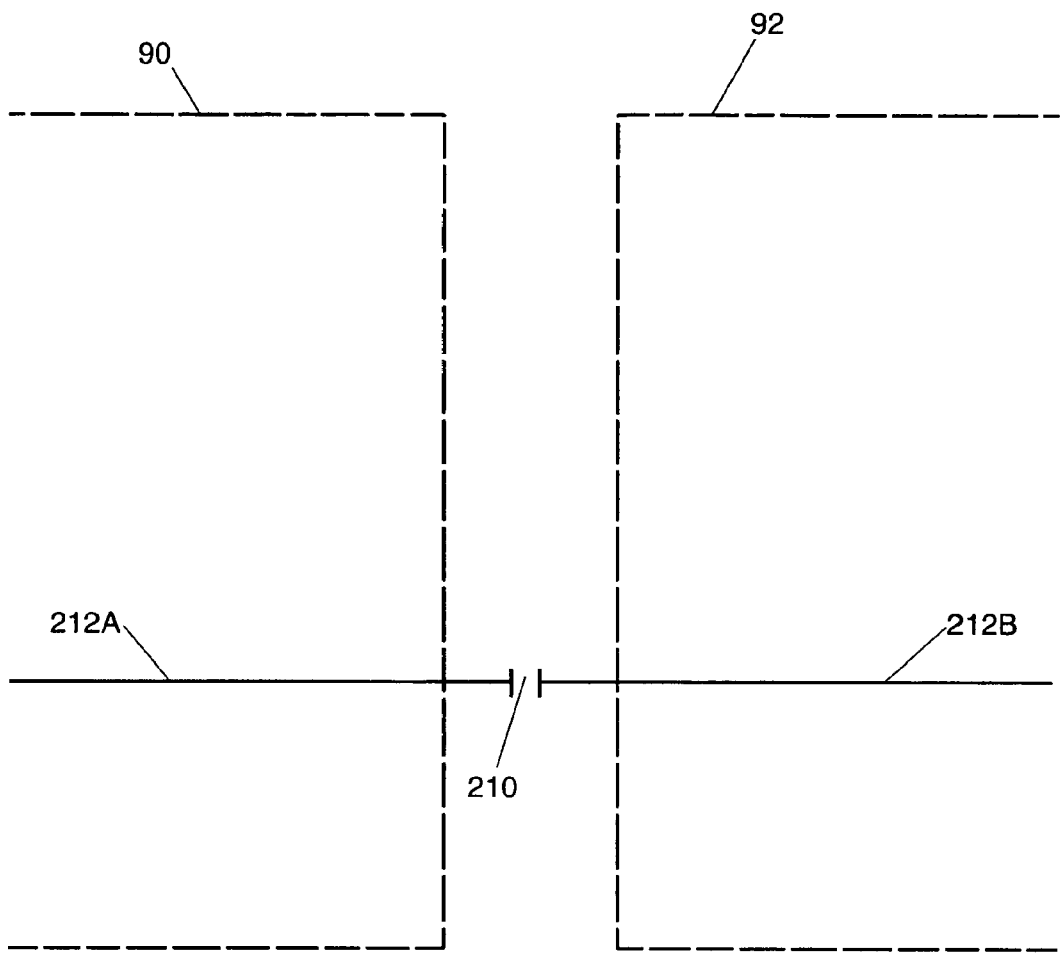
FIG. 9 is a schematic diagram illustrating another embodiment of an isolation device of the present system.

FIG. 9 illustrates another embodiment of an isolation device 210. Isolation device 210 is a single isolation antifuse referred to hereinafter as isolation antifuse 210. Isolation antifuse 210 partitions horizontal routing track 212 into isolated horizontal routing tracks 212a and 212b. Isolation antifuse 210 bridges horizontal routing tracks 212a and 212b. Before isolation antifuse 210 is ruptured it is nonconductive and separates the signals between horizontal routing tracks 212a and 212b. Once the user circuit is programmed via concurrent programming, isolation antifuse 210 is programmed to connect tiles 100 and horizontal routing tracks 212a and 212b. Depending on the desired circuit, isolation devices may be programmed making a particular track between tiles conductive or left unprogrammed, leaving a particular track between tiles unconnected.

Figure 10:
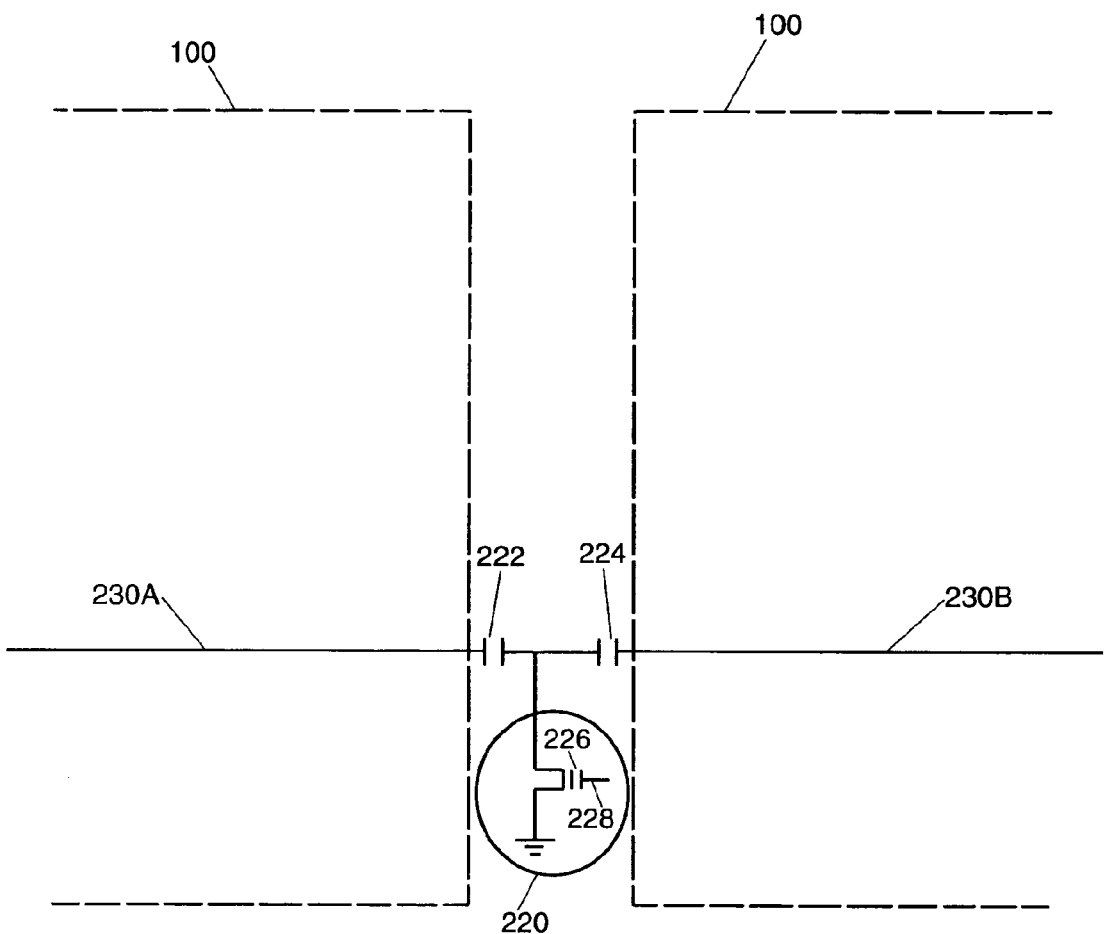
FIG. 10 is a schematic diagram illustrating yet another embodiment of an isolation device of the present system.

FIG. 10 is a schematic diagram illustrating yet another embodiment of isolation device 220. Isolation device 220 partitions horizontal routing track 230 into isolated portions 230a and 230b and also isolating tiles 100. Isolation device 220 comprises antifuses 222 and 224 coupled together through pull-down transistor 226. Pull-down transistor 226 enables programming of fuses 222 and 224 after programming the user circuit in the antifuse FPGA of the present system to connect horizontal routing track 230 into isolated portions 230a and 230b and isolating tiles 100.

As stated above, during programming, each tile can be treated as a separate device, allowing the programming of one antifuse in each tile concurrently, instead of consecutively, and providing a much faster programming environment. In each tile of the FPGA device, the tile level or local control signals are controlled by a bit pattern loaded into a tile mode register. Registers, which store data temporarily, are well known to those skilled in the art and will not be discussed herein in order to avoid complicating and obscuring the present disclosure. All tile mode registers in an antifuse FPGA of the present system can be loaded with different bit-patterns to produce different circuits. Alternatively, all tile mode registers may be loaded with the same bit-pattern with "broadcast mode." Broadcast mode is very practical for the testing of an unprogrammed antifuse FPGA, so that all tile level controls are set to act the same way, and thus produce the same value.

Figure 11:
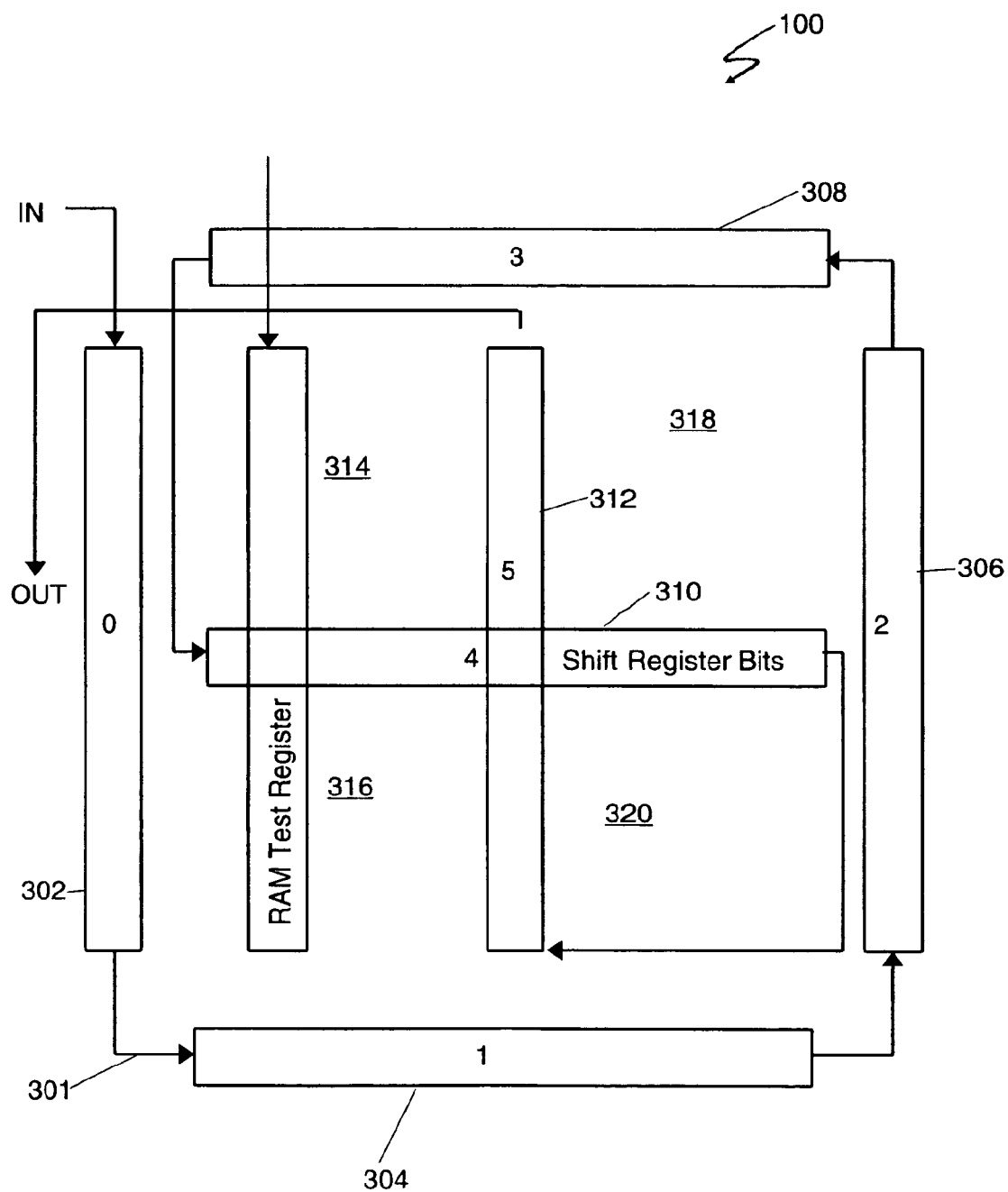
FIG. 11 is a simplified block diagram of an antifuse FPGA tile 200 with a long shift register (LSR).

FIG. 11 is a simplified block diagram of an antifuse FPGA tile 100 (as shown in FIG. 5) with a long shift register (LSR) 301. Long shift register 301 is divided into six peripheries 302, 304, 306, 308, 310 and 312. Tile 300 is divided into four quadrants 314, 316, 318 and 320 surrounded by the six peripheries 302, 304, 306, 308, 310 and 312 of LSR 301. LSR 301 peripheries 302, 304, 306, 308, 310 and 312 are used for testing and programming the device. Inside peripheries 302, 304, 306, 308, 310 and 312 there are register bits and their associated circuits generate the antifuse addressing, regional testing and programming controls. The register bits are chained together within each periphery and between peripheries to form LSR 301. The address of an antifuse being programmed (FBP) is loaded into LSR 301.

The LSR bits belonging to any of the six peripheries as a group can be skipped by setting the appropriate values of the "skip" controls. For example, when all skip controls are set to "1", all the LSR bits of the tile will be skipped. The "skip" function can be used for one or multiple peripheries. Partial skip is useful when a portion of the fuse address bit is the same. Skipping the whole tile is useful when debugging during a circuit failure.

An antifuse FPGA may contain a global mode register. Global mode registers are well known to those skilled in the art and will not be discussed herein in order to avoid complicating the present disclosure. The bit pattern loaded into a global mode register of an antifuse FPGA of the present system sets the chip level controls.

The broadcast mode is enabled when the "DRBCT" bit in the global mode register is set. When the broadcast mode is enabled, the same pattern is loaded into all tile level tile mode registers and LSRs. This function is useful for testing unprogrammed FPGAs and allows for parallel testing of all tiles in a chip simultaneously.

To facilitate parallel programming, there are separate external programming voltage power supply pins, Vpp pins, for each tile. During programming, Vpp is set at 5 volts and capable of sourcing more than 20 mA. During testing and normal operation, the voltage is lowered to Vcc (2.55-3.3V), the operating voltage. When the GMR control signal is set to "VPPHH", all the internal Vpp pins are tied together for parallel testing.

Each tile may also include a single bit mask register. Mask registers are well known to those skilled in the art and will not be discussed herein in order to avoid complicating the present disclosure. When the mask register bit is set, the Vpp voltage is applied to all FBP in each tile and Vpp/2 is applied to all other antifuses in the FPGA. When the mask register bit is reset, it prevents the Vpp pulse from reaching the FBP so that the FBPs in each tile are not being reprogrammed. As set forth in greater detail below, when parallel programming an antifuse FPGA, for a given group of tiles, one antifuse per tile may be programmed at the same time.

In another embodiment, the present invention may be applied to an antifuse-based memory array. In this embodiment, the memory array is divided into individually programmable groups and then isolation devices are inserted in the circuit between the individually programmable memory array modules.

Figure 12:
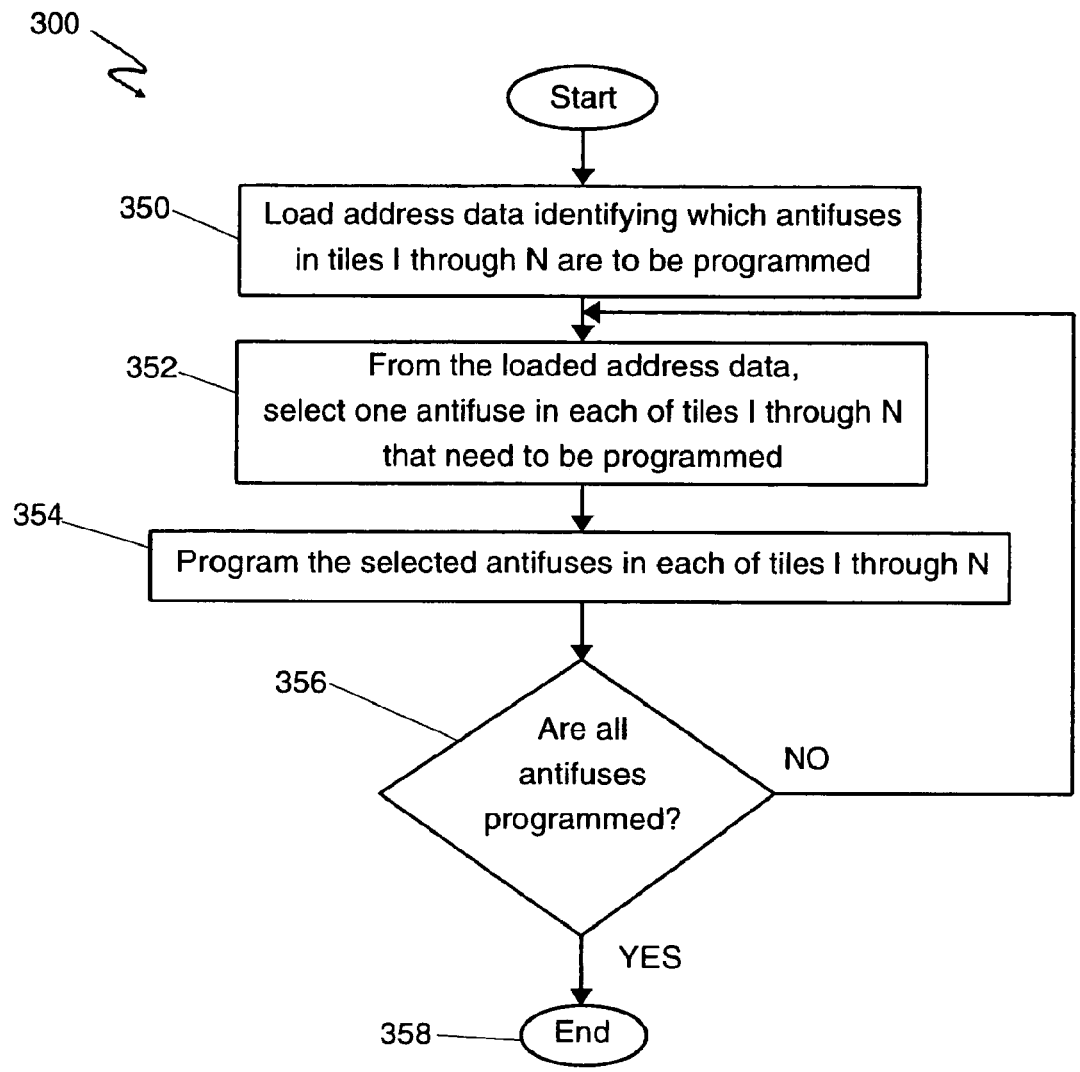
FIG. 12 is a flowchart illustrating a method of programming as disclosed in the present system.

Also disclosed is a method of programming the present system. FIG. 12 is a flowchart illustrating a method of programming as disclosed in the present system. A software module stored on a user's computer system may perform the disclosed method. At act 350, the software module loads the address data identifying which antifuses in tiles 1 through N are to be programmed. As is well known to those of ordinary skill in the art, the address data for the antifuses to be programmed are selected according to a netlist defined by an individual user circuit. Each user circuit may be unique and thus every netlist may define different antifuses in different tiles to be programmed. As is also well known to those of ordinary skill in the art having the benefit of this disclosure, an FPGA may be partitioned into any number of tiles as well as just having one tile.

Next, from the loaded address data, the software module selects one antifuse in each of tiles 1 through N that needs to be programmed at act 352. Next, at act 354, the software module programs the selected antifuses concurrently in each of the tiles 1 through N. Next, at query 356 it is determined from the loaded address data whether all the antifuses that need to be programmed in tiles 1 through N have been programmed. If all the antifuses designated for programming in tiles 1 through N are not programmed, the software module returns to act 352 and selects from the loaded addresses the next one antifuse in each tile 1 through N that needs to be programmed. As one skilled in the art having the benefit of this disclosure will realize, not all tiles will have the same number of fuses to be programmed. For example, tile 1 may have one hundred fuses to be programmed while tile two may have one hundred and fifty antifuses to be programmed. Thus, not all tiles will have antifuses to be programmed during the entire parallel programming process. Finally, if all the antifuses designated for programming have been programmed in tiles 1 through N, the program ends at act 358.

Figure 13:
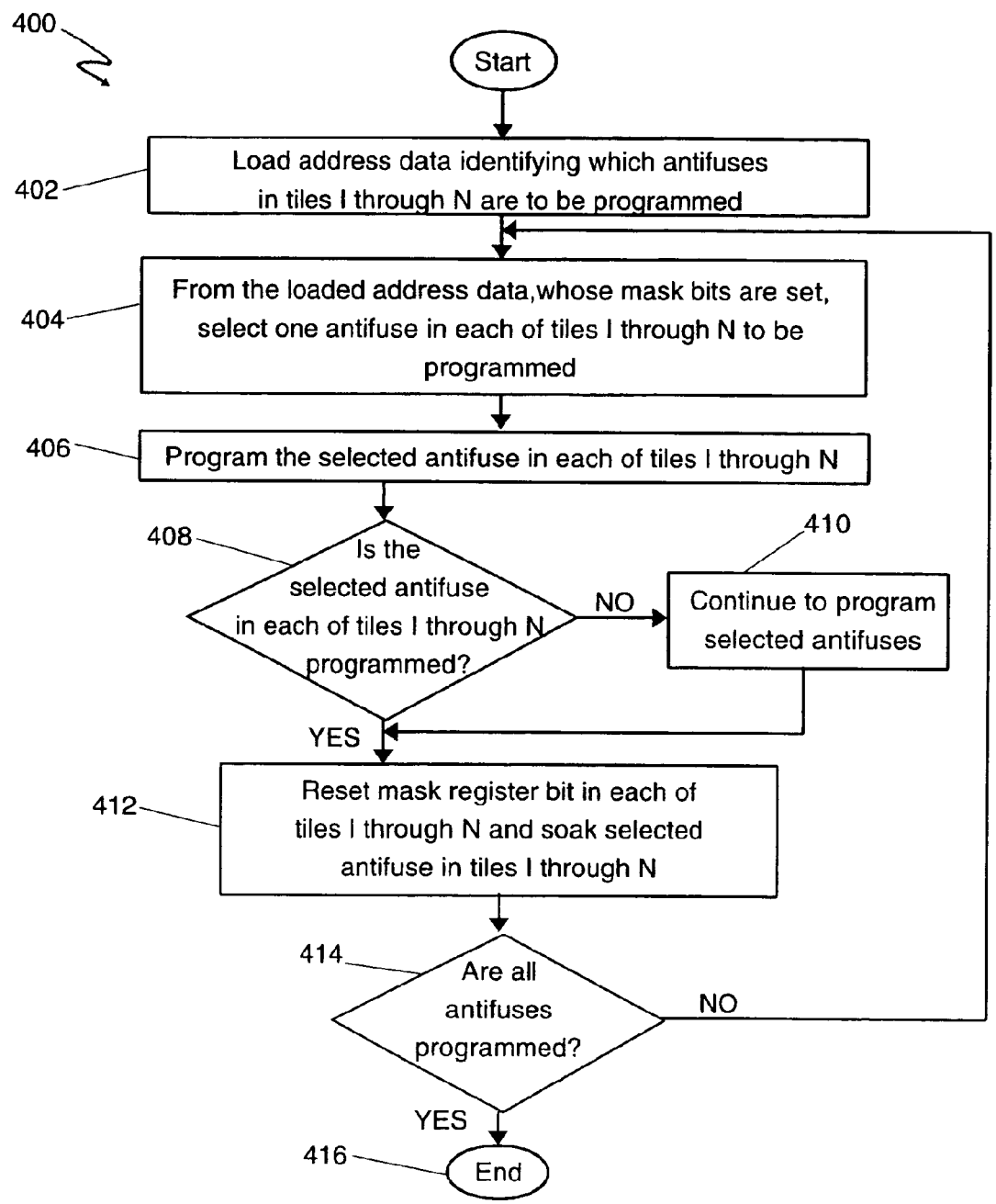
FIG. 13 is a flowchart illustrating another method of programming as disclosed in the present system.

FIG. 13 is a flowchart illustrating another method of programming 400 as disclosed in the present system. A software module stored on the user's system performs the disclosed method. At act 402, the software module loads the address data identifying which antifuses in each of tiles 1 through N are to be programmed. As is well known to those of ordinary skill in the art, the address data for the antifuses to be programmed are selected according to a netlist defined by an individual user circuit. Each user circuit may be unique and thus every netlist may define different antifuses in different tiles to be programmed. As is also well known to those of ordinary skill in the art having the benefit of this disclosure, an FPGA may be partitioned into any number of tiles as well as just having one tile.

At act 404, from the loaded address data the software module selects one antifuse whose mask bits are set in each of tiles 1 through N to be programmed. Next, at act 406, the software module programs the selected antifuses concurrently in tiles 1 through N. At query 408, the software module determines whether the selected antifuses in each of tiles 1 through N have been programmed. If the selected antifuse has not been completely programmed, the software module continues to program the selected antifuse at act 410. At act 412, the software module resets the mask register bit while simultaneously soaking the previously selected antifuses in tiles 1 through N. At query 414, the software module determines whether all antifuses designated for programming have been programmed. As one skilled in the art having the benefit of this disclosure will realize, not all tiles will have the same number of fuses to be programmed. For example, tile 1 may have one hundred fuses to be programmed while tile two may have one hundred and fifty antifuses to be programmed. Thus, not all tiles will have antifuses to be programmed during the entire parallel programming process.

If all the antifuses in tiles 1 through N are not programmed, the software module returns to act 352 and selects from the loaded addresses the next one antifuse in each tile 1 through N that needs to be programmed. Finally, if all the antifuses designated for programming have been programmed in tiles 1 through N, the program ends at act 358.

In another embodiment, the above method of programming may be applied to antifuse memory arrays using the same steps as set forth above applicable to logic arrays.

While embodiments and applications of this system have been shown and described, it would be apparent to those skilled in the art that many more modifications than mentioned above are possible without departing from the inventive concepts herein. The system, therefore, is not to be restricted except in the spirit of the appended claims.

The invention claimed is:

1. In a FPGA having a plurality of individually programmable tiles of logic modules, each logic module including a plurality of antifuses, a method for programming selected antifuses in each of the tiles comprising:

loading for each tile address data identifying ones of the plurality of antifuses designated for programming;

selecting for each tile the address of one of the antifuses designated for programming;

programming concurrently in each tile the antifuse identified by the selected address;

determining whether all of the selected antifuses designated for programming have been programmed;

continuing to program any ones of the antifuses designated for programming that have not been programmed;

soaking the programmed antifuses in each tile;

determining whether the antifuse designated for programming in each tile has been programmed;

determining whether all antifuses designated for programming have been programmed; and repeating the selecting, programming, determining and the soaking if all antifuses designated for programming have not been programmed.

2. The method of claim 1 wherein loading for each tile address data identifying ones of the plurality of antifuses designated for programming comprises setting a mask bit for the designated antifuse.

3. The method of claim 1 further including resetting the mask register bit in each tile for each antifuse that has been programmed.

4. The method of claim 3 wherein soaking the programmed antifuses in each tile and resetting the mask register bit in each tile are performed simultaneously.

5. The method of claim 1 wherein loading for each tile address data identifying ones of the plurality of antifuses designated for programming further comprises identifying the address data from a netlist describing the circuit to be programmed into the FPGA.

6. The method of claim 1 wherein selecting for each tile the address of one of the antifuses designated for programming comprises selecting the address of one of the antifuses associated with a mask register bit that has been set.

7. The method of claim 1 wherein determining whether all antifuses designated for programming have been programmed comprises determining whether any mask register bits remain set.

8. In a FPGA having a plurality of individually programmable tiles of logic modules, each logic module including a plurality of antifuses, apparatus for programming selected antifuses in each of the tiles comprising:

means for loading for each tile address data identifying ones of the plurality of antifuses designated for programming;

means for selecting for each tile the address of one of the antifuses designated for programming;

means for programming concurrently in each tile the antifuse identified by the selected address;

means for determining whether all of the selected antifuses designated for programming have been programmed;

means for continuing to program any ones of the antifuses designated for programming that have not been programmed;

means for soaking the programmed antifuses in each tile;

means for determining whether the antifuse designated for programming in each tile has been programmed;

means for determining whether all antifuses designated for programming have been programmed; and means for repeating the selecting, programming, determining and the soaking if all antifuses designated for programming have not been programmed.

9. The apparatus of claim 7 wherein means for loading for each tile address data identifying ones of the plurality of antifuses designated for programming further comprises means for identifying the address data from a netlist describing the circuit to be programmed into the FPGA.

* * * * *